United States Patent
Pokidov et al.

(10) Patent No.: US 12,207,385 B2
(45) Date of Patent: Jan. 21, 2025

(54) METHOD AND APPARATUS FOR PLASMA IGNITION IN TOROIDAL PLASMA SOURCES

(71) Applicant: MKS Instruments, Inc., Andover, MA (US)

(72) Inventors: Ilya Pokidov, Winchester, MA (US); Chiu-Ying Tai, Chelmsford, MA (US); Joseph Desjardins, Bedford, NH (US); Gordon Hill, Arlington, MA (US); Michael Harris, Hudson, MA (US)

(73) Assignee: MKS Instruments, Inc., Andover, MA (US)

( * ) Notice: Subject to any disclaimer, the term of this patent is extended or adjusted under 35 U.S.C. 154(b) by 171 days.

(21) Appl. No.: 18/112,712

(22) Filed: Feb. 22, 2023

(65) Prior Publication Data

US 2024/0284584 A1   Aug. 22, 2024

(51) Int. Cl.
| | |
|---|---|
| *H05H 1/00* | (2006.01) |
| *H05H 1/46* | (2006.01) |
| *H05H 1/52* | (2006.01) |
| *H01J 37/32* | (2006.01) |

(52) U.S. Cl.
CPC .......... *H05H 1/52* (2013.01); *H05H 1/4652* (2021.05); *H01J 37/32467* (2013.01); *H05H 2242/10* (2013.01)

(58) Field of Classification Search
CPC ............... H01J 37/32467; H01J 37/321; H01J 37/32357; H01J 37/32522; H05H 1/52; H05H 1/4652; H05H 2242/10
See application file for complete search history.

(56) References Cited

U.S. PATENT DOCUMENTS

| | | | |
|---|---|---|---|
| 4,994,715 A * | 2/1991 | Asmus | G03F 7/70016 315/111.21 |
| 7,501,600 B2 | 3/2009 | Holber et al. | |
| 7,659,489 B2 | 2/2010 | Holber et al. | |
| 8,053,700 B2 | 11/2011 | Schuss et al. | |
| 11,019,715 B2 | 5/2021 | Chen et al. | |
| 2003/0071035 A1* | 4/2003 | Brailove | H05H 1/46 219/635 |
| 2017/0303382 A1* | 10/2017 | Smith | H01J 37/32247 |
| 2017/0309456 A1* | 10/2017 | Hu | C23C 16/50 |
| 2020/0022246 A1 | 1/2020 | Chen et al. | |

* cited by examiner

*Primary Examiner* — Tuan T Lam
(74) *Attorney, Agent, or Firm* — Cesari and McKenna, LLP

(57) ABSTRACT

A plasma apparatus of a plasma processing system is provided. The plasma apparatus defines a toroidal plasma channel and includes multiple end blocks defining respective portions of the toroidal plasma channel. Each end block includes an end-block tube constructed from a first electrically conductive material and a dielectric coating disposed on an interior surface of the end-block tube. The plasma apparatus also includes multiple mid-blocks defining respective portions of the toroidal plasma channel. Each mid-block includes at least one heat sink located adjacent to a substantially linear tube with a thermal interface disposed therebetween. The thermal interface is in physical communication with the tube and the at least one heat sink. The mid-block tube has a substantially uniform wall thickness and is constructed from a dielectric material. The at least one heat sink is constructed from a second electrically conductive material.

20 Claims, 4 Drawing Sheets

METHOD AND APPARATUS FOR PLASMA IGNITION IN TOROIDAL PLASMA SOURCES

FIELD OF THE INVENTION

The invention relates generally to plasma generation and processing equipment, and more specifically, to igniting a plasma in an inductively coupled toroidal plasma source.

BACKGROUND

Plasma discharges can be used to excite gases to produce activated gases containing ions, free radicals, atoms and molecules. Activated gases are used for numerous industrial and scientific applications, including processing solid materials such as semiconductor wafers, powders, and other gases. The parameters of the plasma and the conditions of the exposure of the plasma to the material being processed vary widely depending on the application.

Plasmas can be generated in various ways including direct current (DC) discharge, radio frequency (RF) discharge, and microwave discharge. DC discharges are achieved by applying a potential between two electrodes in a gas. RF discharges are achieved either by capacitively or inductively coupling energy from a power supply into a plasma. Microwave discharges can be produced by coupling a microwave energy source to a discharge chamber containing a gas.

Plasma discharges can be generated in a manner such that both the charged species constituting the plasma and the neutral species, which can be activated by the plasma, are in intimate contact with the material being processed. Alternatively, the plasma discharge can be generated remotely from the material being processed, so that relatively few of the charged species contact the material being processed, while the neutral species can still contact it. Such a plasma discharge is commonly termed a remote plasma discharge. Depending on its construction, positioning relative to the material being processed, and operating conditions (e.g., gas species, pressure, flow rate, and power coupled into the plasma), a plasma source can have characteristics of either or both of these two general types.

Toroidal plasma sources are usually constructed either from metal with a thin dielectric layer on the plasma facing surface or from a dielectric material. They also include a closed channel in the form of a toroid or a racetrack for confining the plasma, usually referred to as the plasma channel. Such plasma sources are characterized by a low induced electric field, and therefore, typically require additional means for generating a short high voltage pulse to break down the gas and initiate or ignite a plasma. FIG. 1 shows an exemplary prior art toroidal remote plasma system, including a toroidal plasma source 10. In some embodiments, the short high voltage pulse for ionizing the gas is applied to an electrode 30 positioned directly inside the plasma chamber 20. In some embodiments, the short high voltage pulse is applied to an electrode 32 that is separated from the plasma chamber 20 by a dielectric window, thus creating a dielectric barrier discharge for initiating a plasma. Ignition embodiments of FIG. 1 are examples of what is referred to as spark plug ignition.

FIG. 2 shows another exemplary prior art toroidal remote plasma source 121 constructed from a plurality of metal blocks 139, 140, 141 and 142 and including a plurality of dielectric gaps or breaks 134A-C. Such dielectric gaps 134A-C are necessary for the successful operation of the toroidal plasma source 121 having a metal chamber to prevent large amount of induced current from circulating through the metal plasma chamber and bypassing the plasma. In the embodiment of FIG. 2, two blocks 139 and 140 are electrically floating with respect to the blocks 141 and 142, which can be grounded. Therefore, applying a short high voltage pulse to the floating blocks 139 and 140 can create a capacitive discharge inside the plasma channel at the four gaps 134A-C for igniting a plasma. This type of an ignition embodiment is referred to as block or gap ignition.

The prior art toroidal remote plasma systems of FIGS. 1 and 2 usually require easy to ionize gases such as Argon or other noble gases to ignite a plasma. An exemplary two-step approach for generating a toroidal plasma 14 within the plasma source 10 of FIG. 1 involves first creating a localized capacitive or dielectric barrier discharge inside the plasma chamber 20 by applying a short high voltage pulse (hereinafter referred to as the "spark voltage") to the electrode 32. The second step is forming an inductively coupled toroidal plasma 14 inside the plasma chamber 20. This is accomplished by applying a relatively high voltage to a primary winding 18 of a transformer 12 located adjacent to the plasma chamber 20, thus inducing a relatively high secondary voltage or electric field along the toroidal plasma loop 14 (hereinafter referred to as the "loop voltage" or "loop electric field") in accordance with Faraday's law. During the first step, a relatively small number of free seed electrons are generated inside the plasma chamber 20 in the vicinity of the ignition electrode 32. In the second step, the relatively high induced toroidal electric field in combination with the presence of free electrons facilitate the transition to the inductive mode and the formation of the toroidal plasma 14. Only after a stable toroidal plasma 14 is formed in the plasma chamber 20 a transition from the easily ionized ignition gas, such as Argon, to a different process gas can occur.

Exemplary process gases used in semiconductor fabrication processes include monoatomic or noble gases, such as Argon. For certain downstream plasma processing applications, the toroidal remote plasma system 10 of FIG. 1 is adapted to use molecular gases, such as nitrogen ($N_2$) or ammonia ($NH_3$). In addition, for certain downstream plasma processing applications, the remote plasma processing system 10 of FIG. 1 uses molecular electro-negative gases, such as oxygen ($O_2$), hydrogen ($H_2$), fluorine ($F_2$), or chlorine ($Cl_2$). Molecular and particularly electro-negative gases are significantly more difficult to ionize than noble gases and, therefore, require significantly higher spark and loop voltages during plasma ignition to form the toroidal plasma 14.

It may be acceptable for some semiconductor processes to ignite the remote toroidal plasma in a noble gas, such as Argon, and then transition to a different process gas. Such transitions, however, can last on the order of several seconds to several tens of seconds, and can therefore, be detrimental to certain short semiconductor processes, whereby the additional time required to transition from the ignition gas to the process gas can result in the loss of throughput. Such processes can benefit from being able to ignite the toroidal plasma directly in the presence of process gases.

However, certain physical limitations associated with the construction of a metal toroidal plasma chamber with a dielectric coating particularly limit the amplitude of both loop and spark voltages that can be applied during ignition. Thus, there is a need for a special toroidal plasma chamber apparatus capable of withstanding the increased loop and/or spark electric fields required for igniting the toroidal plasma directly in the presence of process gases.

SUMMARY

The present technology provides toroidal plasma source designs that facilitate process gas ignition by achieving increased spark and/or loop electric fields without a significant risk of dielectric breakdown of the protective coating in the toroidal plasma channel. The toroidal plasma source designs of the present technology can also achieve capacitive spark discharge formation over a large portion of the plasma loop, thereby further facilitating process gas ignition. Another feature of the present toroidal plasma source designs is that they enable relatively straightforward modification of existing plasma sources (e.g., plasma source 121 of FIG. 2) to achieve the enhanced process gas ignition.

In one aspect, a plasma source apparatus of a plasma processing system is provided. The plasma apparatus defines a toroidal plasma channel. The plasma apparatus includes a plurality of end blocks defining respective portions of the toroidal plasma channel. Each end block comprises an end-block tube constructed from a first electrically conductive material and a dielectric coating disposed on an interior surface of the end-block tube. The plasma apparatus also includes a plurality of mid-blocks defining respective portions of the toroidal plasma channel. Each mid-block comprises at least one heat sink located adjacent to a substantially linear tube with a thermal interface disposed therebetween. The thermal interface is in physical communication with the tube and the at least one heat sink. The mid-block tube has a substantially uniform wall thickness and is constructed from a dielectric material. The at least one heat sink is constructed from a second electrically conductive material. The plurality of end blocks and the plurality of mid-blocks are connected to cooperatively define the toroidal plasma channel.

In another aspect, a method for igniting a plasma in a plasma apparatus is provided. The plasma apparatus defines a toroidal plasma channel. The method comprises providing the plasma apparatus including a plurality of end blocks and a plurality of mid-blocks. The end blocks and the mid-blocks are connected to cooperatively define the toroidal plasma channel. Each end block includes an end-block tube constructed from an electrically conductive material and a dielectric coating disposed on an interior surface of the end-block tube. Each mid-block includes at least one electrically conductive heat sink adjacent to a dielectric tube and a thermal interface disposed therebetween. The method also includes electrically biasing the at least one heat sink of each mid-block to generate a capacitive spark discharge inside of the mid-block tube of each mid-block. The method further includes initiating a plasma discharge in a gas in the toroidal plasma channel using the spark discharge.

Any of the above aspects can include one or more of the following features. In some embodiments, the second electrically conductive material of the at least one heat sink is copper. In some embodiments, the dielectric material of each mid-block tube is alumina ($Al_2O_3$), ceramic or sapphire. In some embodiments, the dielectric material of each mid-block tube is quartz ($SiO_2$), an oxide, a nitride of one of group II element or group III element, a lanthanide, or a mixture thereof. In some embodiments, the wall thickness of each mid-block tube is about 1.5 mm.

In some embodiments, the first electrically conductive material of each end-block tube is aluminum. In some embodiments, a thickness of the dielectric coating of each end block is about 40 μm to about 50 μm. In some embodiments, the plurality of end blocks includes at least an inlet block for injecting a gas into the plasma channel and an outlet block for allowing one or more byproducts of a plasma to exit from the plasma channel.

In some embodiments, the at least one heat sink of each mid-block comprises two heat sinks adjacent to the corresponding mid-block tube, each heat sink surrounding approximately one half of an outer circumference of the mid-block tube along a length of the mid-block tube. In some embodiments, an ignition circuit connected to each mid-block. The ignition circuit is configured to bias the two heat sinks at different voltages, thereby applying an electric field to a gas inside the corresponding tube to ignite a plasma therein. In some embodiments, the two heat sinks of each mid-block are electrically isolated from each other. In some embodiments, each mid-block further comprises a plurality of flanges electrically isolating the two heat sinks from each other. The flanges are constructed from an electrically insulating material.

In some embodiments, an ignition circuit is connected to each mid-block. The ignition circuit is configured to bias the at least one heat sink, thereby applying an electric field to a gas inside of the corresponding mid-block tube to ignite a plasma therein. In some embodiments, the end blocks are electrically grounded.

In some embodiments, each mid-block further comprises two face plates located at corresponding two ends of the mid-block tube. The two face plates are constructed from an electrically insulating material to provide electrical isolation between the at least one heat sink of the mid-block and the end blocks during ignition.

BRIEF DESCRIPTION OF THE DRAWINGS

The advantages of the invention described above, together with further advantages, may be better understood by referring to the following description taken in conjunction with the accompanying drawings. The drawings are not necessarily to scale, emphasis instead generally being placed upon illustrating the principles of the technology.

DETAILED DESCRIPTION

Figure 3:
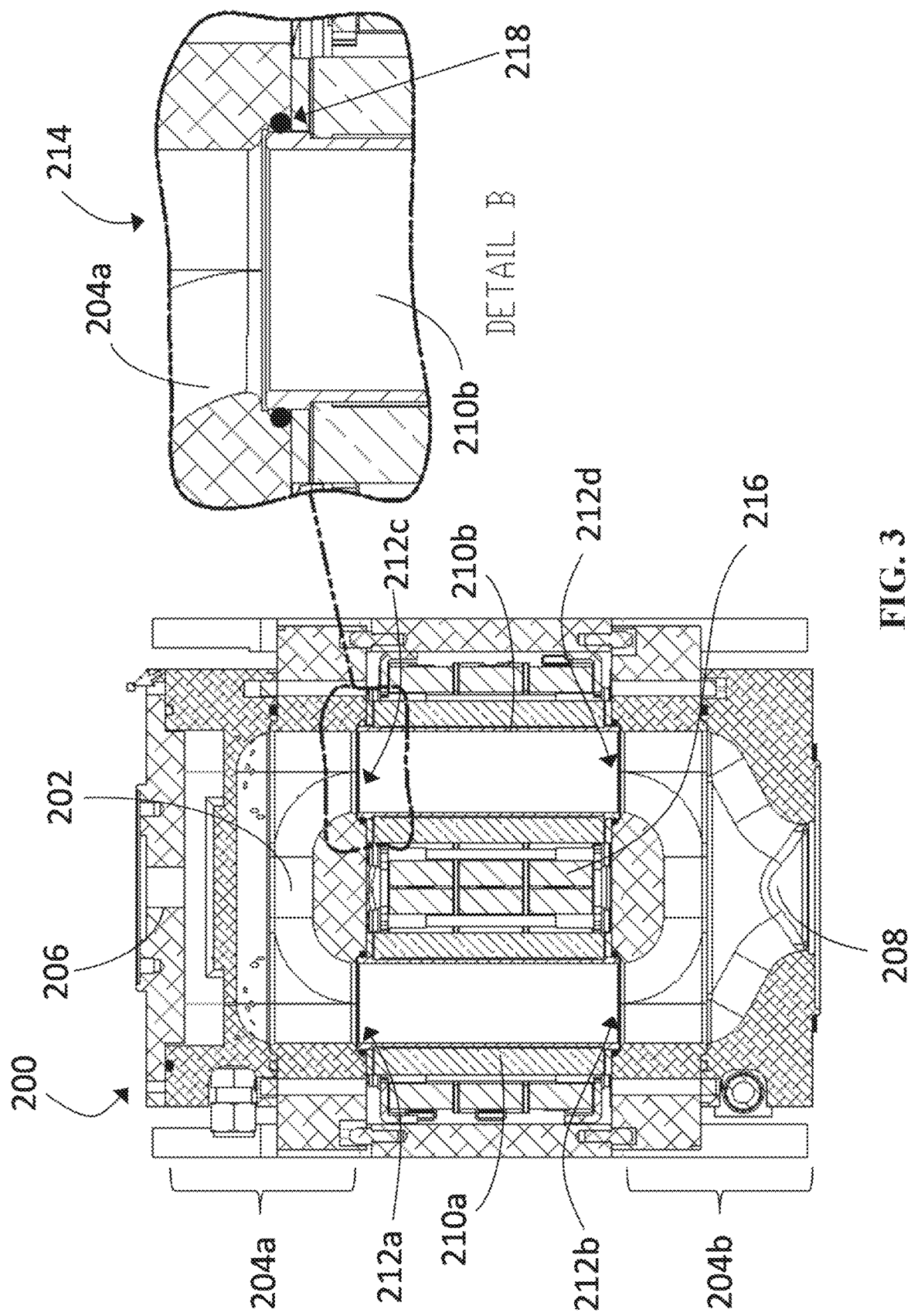
FIG. 3 shows an exemplary toroidal plasma source for generating plasma discharge, according to some embodiments of the present invention.

FIG. 3 shows an exemplary toroidal plasma source 200 for generating plasma discharge, according to some embodiments of the present invention. In some embodiments, the toroidal plasma source 200 serves as a remote plasma source for supplying excited atomic and molecular species to one or more downstream applications. In general, a toroidal plasma source includes multiple segments/blocks interconnected to cooperatively define a toroidal plasma channel, where each block comprises a tubular section of the plasma channel. The multiple blocks of the toroidal plasma source can be divided into two types—end blocks and mid-blocks. Each end block represents a block that includes at least one of an inlet port configured to inject a process gas into the plasma channel or an outlet port configured to allow one or more byproducts of a plasma (e.g., excited atomic and/or molecular species, or molecular fragments) to exit from the plasma channel. Each mid-block represents a block that does not have an inlet port or an outlet port of the toroidal plasma source and serves as an interior segment for forming the toroidal plasma channel.

As shown in FIG. 3, the toroidal plasma source 200 includes two end blocks 204a, 204b (collectively referred to as 204) and two mid-blocks 210a, 210b (collectively referred to as 210) interconnected to cooperatively define a toroidal plasma channel 202. Alternatively, the toroidal plasma source 200 can have more or fewer end blocks 204 and/or more or fewer mid-blocks 210 interconnected to form the toroidal plasma channel 202. Of the two end blocks 204 of the toroidal plasma source 200, one is an inlet block 204a with an inlet port 206 in fluid communication with the plasma channel 202 for injecting a process gas into the plasma channel 202, while the other is an outlet block 204b with an outlet port 208 in fluid communication with the plasma channel 202 for allowing one or more byproducts of the plasma to exit from the plasma channel 202. The toroidal plasma source 200 also includes a transformer 216 substantially surrounding the mid-blocks 210 for coupling power from an RF power supply (not shown) to the plasma. The transformer 216 is also used to induce substantially high loop voltage in the plasma channel 202 during plasma ignition.

Each of the two mid-blocks 210 of the toroidal plasma source 200 is sandwiched between the two end blocks 204. In particular, mid-block 210a has (a) one end along its substantially linear body that is physically connected to an end of the inlet end block 204a to form an interface 212a, and (ii) an opposite end that is physically connected to an end of the outlet end block 204b to form another interface 212b. Similarly, mid-block 210b has one end along its substantially linear body that is physically connected to an end of the inlet end block 204a (different from the end to which mdi-block 210a is connected) to form an interface 212c, while an opposite end of mid-block 210b is physically connected to an end of the outlet end block 204b (different from the end to which mdi-block 210a is connected) to form another interface 212d. The four interfaces 212a-d are herein collectively referred to as 212.

The toroidal remote plasma source 200 typically operates in the pressure range from hundreds of millitorr to tens of torr. Therefore, the plurality of blocks 204, 210 comprising the plasma source 200 are adapted to be interconnected to seal the plasma channel 202 from atmosphere. In some embodiments, a vacuum seal 214 is disposed at each of the interfaces 212 to seal the vacuum inside the plasma channel 202. In the embodiment shown in Detail B inset of FIG. 3, the vacuum is sealed by an O-ring 218 confined inside a triangular gland formed between the mid-block 210b and the end block 204a. Such O-ring gland configuration can reduce O-ring damage by reducing exposure of the O-ring 218 to energetic ions and ultraviolet (UV) radiation emanating from the plasma confined in the plasma channel 202, by limiting the line of sight between the O-ring 218 and the plasma. The vacuum seal 214 at each interface 212 also accommodates small misalignment between the matching cylindrical/tubular features of the corresponding end block 204 and mid-block 210 without placing a large amount of mechanical assembly stress on the mid-block 210, thereby reducing the risk of fracture of various components within the mid-block 210. Other examples of vacuum seals 214 disposed at interfaces 212 can include, but aren't limited to, cylindrical or piston seals and face seals.

In some embodiments, each end block 204 is substantially tubular in construction with the inner volume of each end-block tube defining a tubular portion of the toroidal plasma channel 202. In some embodiments, each end block 204 is constructed from an electrically conductive material. A dielectric coating can be disposed on an interior surface of the end block 204 overlaying the conductive material, such that the dielectric coating is in direct exposure to the gas and/or plasma discharge in the plasma channel 202. The electrically conductive material of each end block 204 can be aluminum, for example. The dielectric coating of each end block 204 can comprise conversion coatings or deposition coatings, for example. Examples of conversion coatings on aluminum can include aluminum oxide formed by hard anodization or plasma electrolytic oxidation. Examples of deposition coatings can include aluminum or yttrium oxide applied by plasma or flame spray, chemical vapor deposition (CVD), physical vapor deposition (PVD) or atomic layer deposition (ALD). In some embodiments, the dielectric coating is about 40 µm to about 50 µm thick.

Figure 4:
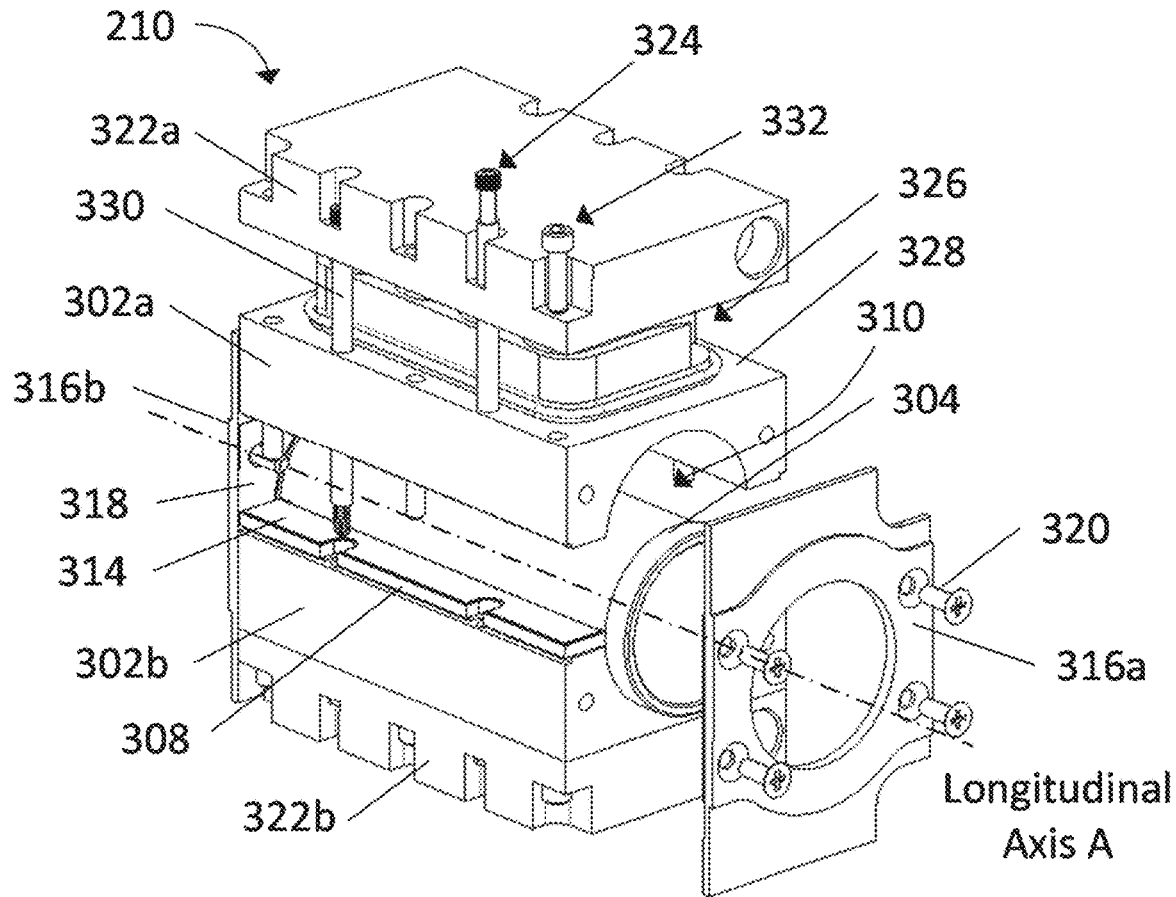
FIG. 4 shows an exemplary design of a mid-block of the toroidal plasma source of FIG. 3, according to some embodiments of the present invention.

FIG. 4 shows an exemplary design of a mid-block 210 of the toroidal plasma source 200 of FIG. 3, according to some embodiments of the present invention. For example, the design of FIG. 4 can be applied to mid-block 210a and/or mid-block 210b of the toroidal plasma source 200 of FIG. 3. In general, the mid-block 210 can include at least one heat sink 302 located adjacent to a substantially linear tube 304 with a thermal interface (not shown) disposed between the heat sink 302 and the linear tube 304. The linear tube 304 can serve as a segment of the toroidal plasma channel 202 of the toroidal plasma source 200 of FIG. 3. In some embodiments, the thermal interface material is sandwiched between and physically contacts both the linear tube 304 and the heat sink 302. For example, the heat sink 302 can substantially surround at least a portion of the thermal interface, which in turn substantially surrounds at least a portion of the outer surface of the linear tube 304.

In the exemplary design of the mid-block 210 of FIG. 4, the linear tube 304 is substantially encapsulated between two heat sinks 302a, 302b (collectively referred to as 302), where each heat sink 302 is adjacent to and surrounding about one half of the outer surface of the tube 304 along the longitudinal axis A (i.e., along the length) of the tube 304. In some embodiments, there is a radial gap 310 located between each heat sink 302 and the tube 304 for forming a thermal interface therebetween. For example, a thermal interface material can be injected into the gap 310 to substantially fill the gap 310, thereby serving as a thermal connection between the tube 304 and the corresponding heat sink 302. Exemplary thermal interface materials include, but aren't limited to, thermal encapsulants (potting compounds), thermal pads, thermal greases and thermally conductive epoxies. For example, a potting compound can be used as a thermal interface material, which is mechanically compliant and highly thermally conductive to encapsulate the tube 304 within the surrounding heat sinks 302.

In some embodiments, the two heat sinks 302a, 302b are physically and/or electrically separated by at least two flanges 308 extending from opposite sides of the linear tube 304 along the length of the tube 304. The flanges 308 can be constructed from the same dielectric material or a different dielectric material in relation to the tube 304. Thus, flanges 308 can provide electrical isolation of the two heat sinks 302a, 302b. Optionally, thermal pads 314 can be placed on both sides of each flange 308 to provide thermal contact between the respective heat sinks 302 and the corresponding flanges 308 as well as serve the function of sealing the thermal interface material (e.g., a potting compound) within the gap 310.

In some embodiments, the tube 304 of the mid-block 210 has a substantially uniform wall thickness, such as about 1.5 mm in thickness. The tube 304 can be constructed from a dielectric material, such as alumina ($Al_2O_3$), ceramic or sapphire. Alternatively, the dielectric material of the tube 304 can be quartz ($SiO_2$), an oxide, a nitride of one of group II element or group III element, a lanthanide, or a mixture thereof. In some embodiments, each heat sink 302 (e.g., heatsinks 302a, 302b) is constructed from an electrically conductive material, such as copper.

In some embodiments, two face plates 316a, 316b (collectively referred to as 316) are provided at corresponding two ends of the tube 304 along the longitudinal axis A of the tube 304. The two face plates 316 are constructed from an electrically insulating material to provide electrical isolation in the longitudinal direction between the one or more heat sinks 302 of the mid-block 210 and the end blocks 204 when the mid-blocks 210 and end blocks 204 are assembled together to form the toroidal plasma source 200. In some embodiments, a thermal pad 318 is disposed on at least one surface of each face plate 316, such as on the surface that physically contacts the heat sinks 302. Similar to the thermal pads 314, thermal pads 318 serve the function of providing thermal contact between the heat sinks 302 and the corresponding face plate 316 while sealing the thermal interface material (e.g., a potting compound) in the gap 310. In some embodiments, each face plate 316 is attached to the heat sinks 304 by one or more plastic screws 320 (e.g., made from a polyetheretherketone (PEEK) material). For example, as shown in FIG. 4, four plastic screws 320 are used to attach each face plate 316 to the two heat sinks 302.

In some embodiments, at least one cover 322 is provided to substantially cover an outer surface of a heat sink 302. In the embodiment of FIG. 4, two covers 322a, 322b (collectively referred to as 322) are used to cover corresponding ones of the two heat sinks 302a, 302b. Each cover 322 can be constructed from an electrically insulating material (e.g., polyetherimide (PEI)) to reduce high voltage stress between the corresponding electrically biased heat sink 302 and an electrically grounded frame of the transformer 216 of FIG. 3 during process gas ignition and minimize the possibility of arcing. Alternatively, each cover 322 can be constructed from a metallic material, provided that adequate steps are taken to mitigate high voltage stress between the corresponding electrically biased heat sink 302 and the electrically grounded transformer 216. In some embodiments, each cover 322 is attached to the corresponding heat sink 302 by one or more screws 332. In some embodiments, the sub-assembly of heatsink 302a and cover 322a is connected to the sub-assembly of heatsink 302b and cover 322b by long metal screws 324 substantially surrounded by respective ones of insulating sleeves 330 to electrically isolate the metal crews 324 from the heat sinks 302 that are biased at high voltage during ignition. In some embodiments, a cooling fluid is provided to a cavity 326 between the cover 322 and the corresponding heat sink 302, where the cooling fluid is sealed inside of the cavity 326 by an o-ring 328 located between the cover 322 and the heat sink 302.

In an exemplary assembly of the mid-block 210 of FIG. 3, the cover 322a is first connected to the heat sink 302a using screws 332 with the O-ring 328 disposed therebetween to produce the first sub-assembly. Then the cover 322b is connected to the heat sink 302b using screws 332 with another O-ring 328 disposed therebetween to produce the second sub-assembly. The tube 304 is then sandwiched between the two heat sink sub-assemblies separated by the insulating plates 308 and locked in place using the long metal screws 324 with insulating sleeves 330 that extend substantially perpendicularly relative to the longitudinal axis A from one cover 322a to the other cover 322b while traversing through the flanges 308 and the two heat sinks 302a, 302b. The distal ends of the mid-block 210 along the longitudinal axis A are covered by the insulating face plates 316a and 316b, which are connected to the rest of the structure via insulating screws 320. Thereafter the thermal interface material can be injected into the gap 310 between the heat sinks 302 and the linear tube 304. Further, a circulating cooling fluid can be provided to the cavity 326 between each of the covers 322 and their corresponding heat sinks 302.

Figure 5:
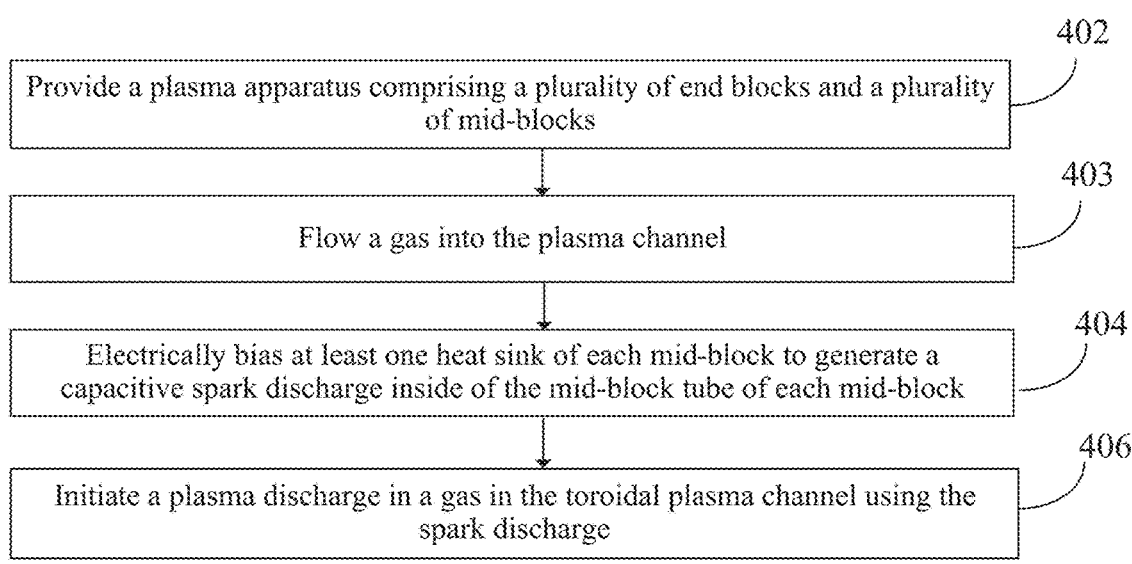
FIG. 5 shows an exemplary method for igniting a plasma in a toroidal plasma source that incorporates the mid-block design of FIG. 4, according to some embodiments of the present invention.

The design of the mid-block 210 in FIG. 4 enhances plasma ignition in a toroidal plasma source, such as the plasma source 200 of FIG. 3, directly in the presence of process gases. FIG. 5 shows an exemplary method for igniting a plasma in a toroidal plasma source that incorporates the mid-block design of FIG. 4, according to some embodiments of the present invention. In general, during plasma ignition, the mid-blocks 210 of the toroidal plasma source 200 are electrically biased relative to the end blocks 204, which are electrically grounded. As shown, at step 402, a toroidal plasma source is provided, such as the plasma source 200 of FIG. 3, where the plasma source includes multiple end blocks 204 and multiple mid-blocks 210 interconnected to cooperatively form a plasma channel 202. In some embodiments, one or more of the mid-blocks 210 (e.g., all of the mid-blocks 210) are constructed using the design described above with reference to FIG. 4.

At step 403, during ignition, a process gas is flown into the plasma channel 202, such as via the inlet port 206 of the inlet end block 204a of the toroidal plasma source 200 of FIG. 3. At step 404, during ignition, the one or more heat sinks 302 of at last one mid-block 210 (e.g., both heat sinks 302a, 302b of both mid-blocks 210a, 210b of the toroidal plasma source 200 of FIG. 3) can be electrically biased to generate a capacitive spark discharge inside of the linear tube 304 of each mid-block 210. Each heat sink 302 of the mid-block 210 thus acts as an ignition electrode. The end blocks 204 (e.g., both end blocks 204a 204b of the plasma source 200 of FIG. 3) are adapted to be electrically grounded during ignition. In some embodiments, the face plates 316 located at the two ends of the tube 304 of a mid-block 210 are adapted to electrically isolate the mid-block 210, including the one or more heat sinks 302 of the mid-block 210, from the grounded end blocks 204 in the direction along the plasma loop of the plasma channel 202.

Figure 6:
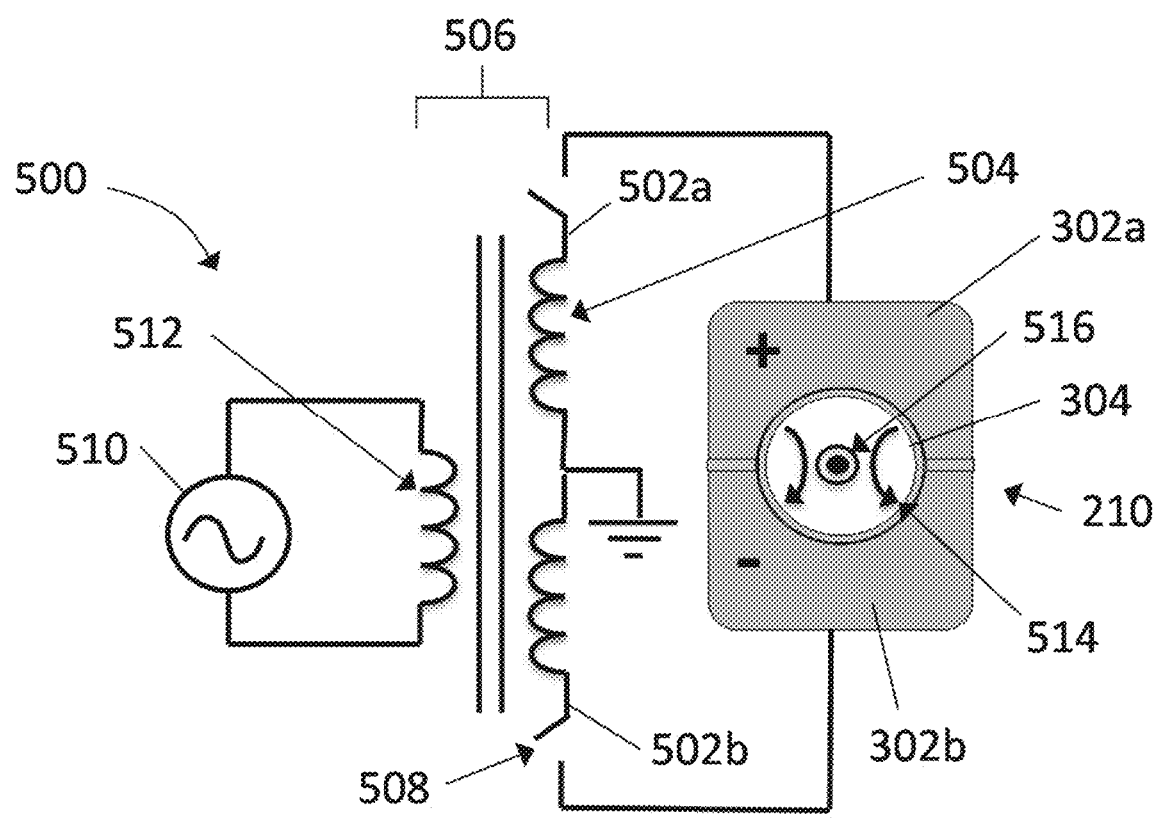
FIG. 6 shows an exemplary configuration of an ignition circuit connected to a mid-block of FIG. 4 for creating localized capacitive discharge, according to some embodiments of the present invention.

In some embodiments, to accomplish spark discharge generation at a mid-block 210, an ignition circuit can be connected to that mid-block 210. FIG. 6 shows an exemplary configuration of an ignition circuit 500 connected to a mid-block 210 of FIG. 4 for creating localized capacitive discharge, according to some embodiments of the present invention. In general, the ignition circuit 500 can apply spark voltages to the two heat sinks 302a, 302b of the mid-block 210 by electrically biasing them at different voltages (e.g., voltages of opposite polarities). Thus, the two heat sinks 302a, 302b can function as two ignition electrodes to generate capacitive spark discharge along the length of the tube 304 parallel to the longitudinal axis A. As shown, the two heat sinks 302a, 302b are connected to the opposite ends 502a, 502b of the secondary winding 504 of a transformer 506 with a grounded center tap. The ignition circuit 500 can also include multiple ignition relays 508 that are closed during ignition to apply biasing to the heat sinks 302a, 302b. For example, during ignition when the ignition relays 508 are closed, one heat sink 302a can be positively biased relative to ground while the other heat sink 302b can be negatively biased relative to ground. A power source 510, such as an RF power supply, can be coupled to the primary winding 512 of the transformer 506 to apply spark voltage to the heat sinks 302a, 302b in the mid-block 210, thereby generating a spark electric field 514 within the mid-block 210, which in turn ionizes the process gas flowing thorough the tube 304 of the mid-block 210 to create a spark discharge within the tube 304. Alternative examples of the power source 510 for providing spark voltage to the heat sinks 302a, 302b include, but aren't limited to, a pulsed DC ignition source or an RF source using a dedicated ignition transformer. Once plasma is ignited, the ignition relays are opened, such that the heat sinks 302a, 302b remain floating relative to the electrical ground.

Referring back to FIG. 5, at step 406, the capacitive spark discharges at the one or more mid-blocks 210 is used to generate an inductive plasma discharge along the plasma channel 202 of a toroidal plasma source, such as the plasma source 200 of FIG. 3. This can be accomplished by applying a relatively high voltage to the primary winding of the transformer 216 (shown in FIG. 3), thus inducing a high electric field along the loop of the toroidal plasma channel 202. In some embodiments, the same transformer 506 of FIG. 6 is used for both spark and loop electric fields generation. Alternatively, a dedicated transformer can be used for each discharge step. The loop electrical field, in combination with the spark discharge generated at the mid-block(s) 210, creates inductive plasma discharges along the toroidal plasma channel 202 while utilizing the process gas in the channel 202. The exemplary circuit 500 of FIG. 6 illustrates both the loop electric field 516 and spark electric field 514 within the mid-block 210. As shown, the direction of the spark electric field 514 is between the two heat sinks 302a, 302b biased at different voltages, while the direction of the loop electric field 516 is along the toroidal plasma channel 202 substantially orthogonal to the direction of the spark electric field 514.

In some embodiments, once plasma is ignited in the mid-block 210, a relatively high heat load can be experienced by the linear tube 304 of each mid-block 210, which is in direct contact with the plasma in the plasma channel 202 as defined by the inner circumference of the tube 304. To address this issue, the tube 304 can be thermally connected to the encapsulating heat sinks 302a, 302b to ensure effective cooling of the tube 304 and prevent a build-up of high thermo-mechanical stress at the tube 304, thereby preventing fracture of the tube 304. Such heat transfer from the tube 304 to the heat sinks 302a, 302b is accomplished by the use of the thermal interface material injected into the gap 310, as described above with reference to FIG. 4.

Figure 2:
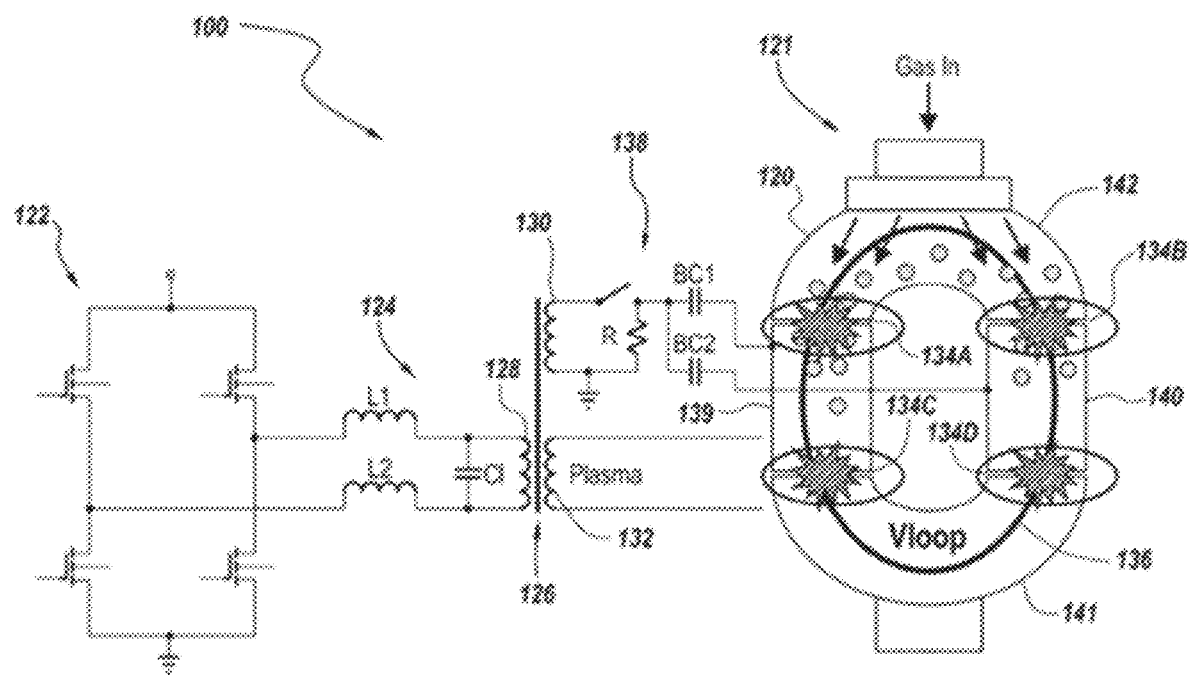
FIG. 2 shows another exemplary prior art toroidal remote plasma system.

In general, the hybrid toroidal plasma sources described herein, including the toroidal plasma source 200 described with reference to FIGS. 3-6, can have segments/blocks with different materials and/or configurations. More specifically, each of the end bocks 204 can be constructed from a tube made from an electrically conductive material with a dielectric coating disposed on the interior surface of the tube, while each of the mid-blocks 210 can be constructed according to the embodiment of FIG. 4. Such a hybrid toroidal plasma source design of the present technology offers several advantages over a traditional toroidal plasma source design where all the segments/blocks are constructed from electrically conductive tubes (e.g., aluminum tubes) with a layer of dielectric coating disposed on the interior surface of each tube, such as the prior art toroidal plasma source design 121 of FIG. 2.

Figure 1:
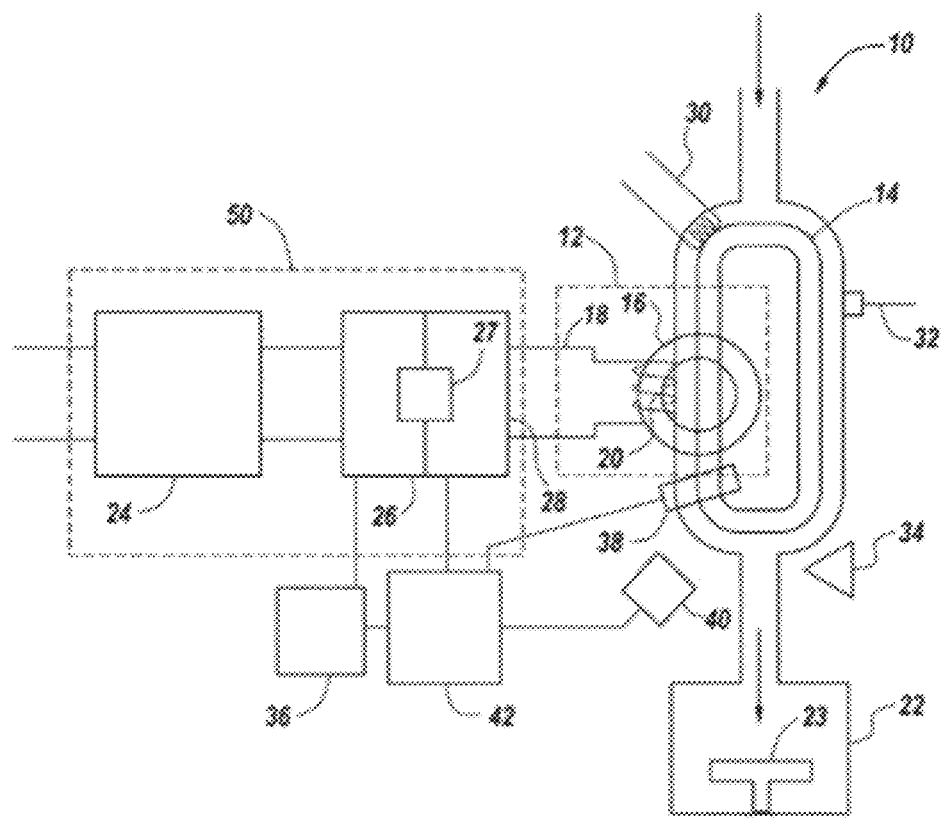
FIG. 1 shows an exemplary prior art toroidal remote plasma system.

One advantage is that the hybrid design of the present technology provides significantly better ignition performance in process gas. Since the thickness of the dielectric tube 304 of a composite mod-block 210 as illustrated in FIG. 4 is relatively thick (e.g., about 1.5 mm) in comparison to the thickness of the dielectric coating (e.g., about 40 µm to about 50 µm) on the conductive tube of a traditional metal block, the ceramic tube 304 of the mid-block 210 can withstand much higher loop and spark voltages applied during ignition, thus significantly reducing the risk of dielectric breakdown. In addition, for the mid-block design of FIG. 4 capacitive spark discharge is adapted to extend over substantially the entire length of each mid-block 210, which is a significant portion of the plasma loop along the plasma channel 202, compared to the traditional toroidal plasma source design in which spark discharge is only formed at either the distinct ignition electrodes 30 or 32 of FIG. 1 or the distinct dielectric breaks 134A-D of FIG. 2 along the plasma loop. Thus, the spark configuration of the present technology allows free electrons to be seeded over a large area of the plasma loop, which facilitates plasma loop formation and the transition to the inductive discharge.

Another advantage of the hybrid design of the present technology is that the spark and loop electric fields are decoupled, as illustrated by the directions of spark electric field 514 and loop electric field 516 of FIG. 6. The dielectric breakdown of the protective coating on the metal portions of a block is predominantly affected by only the loop electric field; the spark electric field makes a relatively small contribution due to weak fringing fields. Such electric field configuration of the present design is much more beneficial for process gas ignition, as it permits an increase of the loop voltage independent from the spark voltage without a significant risk of dielectric coating breakdown in the end blocks 204. This is in contrast with the traditional toroidal plasma source design, where the electric stress on the dielectric coating is dependent on both loop and spark voltages. More specifically, in a traditional plasma source 121 of FIG. 2 utilizing gap ignition, the direction of the spark electric field is across the dielectric breaks 134 from the mid-blocks 139 and 140 toward the end blocks 141 and 142, which coincides with the direction of the plasma loop, if the mid-blocks are biased with respect to the end blocks. The direction of the loop electric field is also along the plasma loop, either clockwise or counterclockwise. Thus, at some of the dielectric breaks of a traditional plasma source, the loop and spark electric fields add up, and if the amplitude of the loop and spark voltage is increased, such that the total electric field across the gap exceeds the breakdown strength of the dielectric coating, coating breakdown or arcing can occur, which can lead to particle and metallic contamination.

Yet another advantage of the hybrid design of the present technology is that because the two heat sinks 302a, 302b, which act as spark ignition electrodes, are biased from the opposite ends of the transformer secondary 504 with a center tap (as illustrated in the ignition circuit 500 of FIG. 6), the voltage between each electrode 302 of a mid-block 210 and the grounded end blocks 204 is only a half of the total spark voltage (voltage between the two ignition electrodes), thereby further reducing voltage stress on the dielectric coating of the end blocks 204.

Yet another advantage of the hybrid design of the present technology is that the overall footprint of the hybrid plasma block design, which incorporates the composite mid-block design of FIG. 4, is about the same as that of the traditional plasma source. In some embodiments, the mid-blocks of the traditional plasma source (where each mid-block includes an electrically conductive tube with a layer of dielectric coating) can be substituted with the mid-block design of FIG. 4 to derive the hybrid design of the present technology. Therefore, the hybrid toroidal plasma source of the present technology can be used in substantially all of the semiconductor processing applications where the traditional toroidal plasma source is used, such as in both chamber cleaning and on-wafer applications to offer improved process gas ignition.

The hybrid design of a toroidal plasma source of the present technology also offers several advantages in comparison to a traditional toroidal plasma source with all the segments/blocks constructed from a dielectric material. The principal challenge of constructing a plasma source with a hollow toroidal plasma chamber from exclusively a dielectric material is the difficulty associated with manufacturing the plasma source. This is because a very limited number of dielectric materials and a very limited number of manufacturing techniques can be used to generate the toroidal shape, thus making the manufacturing cost prohibitively expensive. The instant hybrid design offers the advantage of only using dielectric materials to make relatively straight tubular shapes, such as the linear dielectric tubes 304 of the mid-blocks 210. Any relatively complex geometry necessary to complete the toroidal plasma channel 202 can be machined into the metal components of the blocks. Thus, there are many more dielectric material options available for constructing the linear tubes 304 of the instant design, including, but not limited to, many amorphous and single crystal dielectric materials, such as silicon oxide ($SiO_2$), sapphire, yttrium aluminum garnet (YAG), aluminum oxide ($Al_2O_3$), yttrium oxide ($Y_2O_3$), aluminum nitride (AlN), and magnesium oxide (MgO), thereby keeping the manufacturing cost relatively low.

While the invention has been particularly shown and described with reference to specific embodiments, it should be understood by those skilled in the art that various changes in form and detail may be made therein without departing from the spirit and scope of the invention as defined by the appended claims.

What is claimed is:

1. A plasma apparatus of a plasma processing system, the plasma apparatus defining a toroidal plasma channel, the plasma apparatus comprising:
  a plurality of end blocks defining respective portions of the toroidal plasma channel, each end block comprising an end-block tube constructed from a first electrically conductive material and a dielectric coating disposed on an interior surface of the end-block tube; and
  a plurality of mid-blocks defining respective portions of the toroidal plasma channel, each mid-block comprising at least one heat sink located adjacent to a substantially linear tube with a thermal interface disposed therebetween, the thermal interface in physical communication with the tube and the at least one heat sink, wherein the mid-block tube has a substantially uniform wall thickness and is constructed from a dielectric material, and wherein the at least one heat sink is constructed from a second electrically conductive material,
  wherein the plurality of end blocks and the plurality of mid-blocks are connected to cooperatively define the toroidal plasma channel.

2. The plasma apparatus of claim 1, wherein the second electrically conductive material of the at least one heat sink is copper.

3. The plasma apparatus of claim 1, wherein the dielectric material of each mid-block tube is alumina ($Al_2O_3$), ceramic or sapphire.

4. The plasma apparatus of claim 1, wherein the dielectric material of each mid-block tube is quartz ($SiO_2$), an oxide, a nitride of one of group II element or group III element, a lanthanide, or a mixture thereof.

5. The plasma apparatus of claim 1, wherein the wall thickness of each mid-block tube is about 1.5 mm.

6. The plasma apparatus of claim 1, wherein the at least one heat sink of each mid-block comprises two heat sinks adjacent to the corresponding mid-block tube, each heat sink surrounding approximately one half of an outer circumference of the mid-block tube along a length of the mid-block tube.

7. The plasma apparatus of claim 1, further comprising an ignition circuit connected to each mid-block, the ignition circuit configured to bias the at least one heat sink, thereby applying an electric field to a gas inside of the corresponding mid-block tube to ignite a plasma therein.

8. The plasma apparatus of claim 6, further comprising an ignition circuit connected to each mid-block, the ignition circuit configured to bias the two heat sinks at different voltages, thereby applying an electric field to a gas inside the corresponding tube to ignite a plasma therein.

9. The plasma apparatus of claim 1, wherein the plurality of end blocks are electrically grounded.

10. The plasma apparatus of claim 6, wherein each mid-block further comprises a plurality of flanges electrically isolating the two heat sinks from each other, the plurality of flanges constructed from an electrically insulating material.

11. The plasma apparatus of claim 1, wherein each mid-block further comprises two face plates located at corresponding two ends of the mid-block tube, the two face plates constructed from an electrically insulating material to provide electrical isolation between the at least one heat sink of the mid-block and the end blocks during ignition.

12. The plasma apparatus of claim 1, wherein a thickness of the dielectric coating is about 40 μm to about 50 μm.

13. The plasma apparatus of claim 1, wherein the first electrically conductive material of each end-block tube is aluminum.

14. The plasma apparatus of claim 1, wherein the plurality of end blocks includes at least an inlet block for injecting a gas into the plasma channel and an outlet block for allowing one or more byproducts of a plasma to exit from the plasma channel.

15. A method for igniting a plasma in a plasma apparatus that defines a toroidal plasma channel, the method comprising:
  providing the plasma apparatus comprising a plurality of end blocks and a plurality of mid-blocks, the end blocks and the mid-blocks being connected to cooperatively define the toroidal plasma channel, wherein each end block includes an end-block tube constructed from an electrically conductive material and a dielectric coating disposed on an interior surface of the end-block tube, and wherein each mid-block includes at least one electrically conductive heat sink adjacent to a dielectric tube and a thermal interface disposed therebetween;

electrically biasing the at least one heat sink of each mid-block to generate a capacitive spark discharge inside of the mid-block tube of each mid-block; and initiating a plasma discharge in a gas in the toroidal plasma channel using the spark discharge.

16. The method of claim 15, further comprising electrically isolating the at least one heat sink of each mid-block from the plurality of end blocks.

17. The method of claim 15, wherein the at least one heat sink of each mid-block comprises two heat sinks adjacent to the corresponding mid-block tube, each heat sink surrounding approximately one half of an outer circumference of the mid-block tube along a length of the mid-block tube.

18. The method of claim 17, further comprising electrically isolating the two heat sinks of each mid-block from each other.

19. The method of claim 17, further comprising electrically biasing the two heat sinks at different voltages, thereby applying an electric field to a gas inside the corresponding mid-block tube to initiate the plasma discharge.

20. The method of claim 15, further comprising electrically grounding the plurality of end blocks.

* * * * *